(12) United States Patent
Cusinato et al.

(10) Patent No.: US 6,489,907 B2
(45) Date of Patent: Dec. 3, 2002

(54) METHOD OF RE-ESTABLISHING THE STABILITY OF A SIGMA-DELTA MODULATOR AND A CIRCUIT FOR IMPLEMENTING THE METHOD

(75) Inventors: Paolo Cusinato, Sestri Levante (IT); Andrea Baschirotto, Tortona (IT); Fabio Pasolini, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/919,509

(22) Filed: Jul. 30, 2001

(65) Prior Publication Data

US 2002/0030618 A1 Mar. 14, 2002

(30) Foreign Application Priority Data

Jul. 31, 2000 (IT) .................................. RM2000A000425

(51) Int. Cl.[7] ................................................ H03M 3/00
(52) U.S. Cl. ........................ 341/143; 341/200; 341/155
(58) Field of Search .................................. 341/143, 200, 341/155, 144

(56) References Cited

U.S. PATENT DOCUMENTS

| | | | | |
|---|---|---|---|---|
| 5,012,244 A | * | 4/1991 | Wellard et al. | |
| 5,162,799 A | * | 11/1992 | Tanimoto | 341/143 |
| 5,248,972 A | * | 9/1993 | Karema et al. | 341/143 |
| 5,742,246 A | * | 4/1998 | Kuo et al. | 341/143 |
| 5,757,301 A | * | 5/1998 | Kuo et al. | 341/143 |
| 5,805,093 A | * | 9/1998 | Heikkila et al. | 341/143 |
| 6,061,009 A | * | 5/2000 | Krone et al. | 341/143 |
| 6,157,331 A | * | 12/2000 | Liu et al. | 341/143 |

* cited by examiner

*Primary Examiner*—Peguy Jeanpierre
*Assistant Examiner*—Jean Bruner JeanGlaude
(74) *Attorney, Agent, or Firm*—Lisa K. Jorgenson; E. Russell Tarleton; Seed IP Law Group PLLC

(57) ABSTRACT

A method of re-establishing the stability of a sigma-delta modulator having a plurality of integrator stages in cascade and a quantizer, achieving very short resetting times, a bit sequence corresponding to an instability state of the modulator is defined, the bit-stream output by the modulator is monitored to check whether it includes the instability sequence and, if the instability sequence is detected, the last integrator stage is reset and one or more preceding integrator stages are reset, progressively, until the instability sequence is no longer detected.

14 Claims, 2 Drawing Sheets

US 6,489,907 B2

METHOD OF RE-ESTABLISHING THE STABILITY OF A SIGMA-DELTA MODULATOR AND A CIRCUIT FOR IMPLEMENTING THE METHOD

BACKGROUND OF THE INVENTION

1. Field of the Invention

The present invention relates in general to sigma-delta modulators and, more particularly, to a method and to a circuit for detecting an instability condition of a sigma-delta modulator of an order greater than one and for re-establishing stable operating conditions of the modulator.

2. Description of the Related Art

As is known, sigma-delta modulation is a technique which can achieve a high-resolution analog-digital conversion. According to this technique, an analog signal is "over-sampled", that is, it is sampled at a rate much greater than that which is necessary for a conventional analog-digital converter operating at the Nyquist frequency. A sigma-delta modulator integrates the analog signal and performs a conventional delta modulation on the integral of the signal. For this purpose, the modulator uses a low-resolution quantizer. The output signal of the quantizer is added, with its sign inverted, to the analog input signal, by a feedback loop containing a digital-analog converter.

In order to produce a digital signal corresponding to the analog input signal, the signal output by the modulator is subjected to the action of a so-called digital decimation filter which produces a digital output signal at a sampling frequency equal to twice the Nyquist frequency. By virtue of the over-sampling and of the digital decimation, this technique achieves greater resolution and less distortion than can be achieved by the Nyquist-frequency conversion technique. Moreover, since the error signal, that is, the difference between the input signal and the sampled signal, is integrated, the sigma-delta modulator acts as a low-pass filter for the signal and as a high-pass filter for the quantization noise. It therefore attenuates the noise in the signal band particularly effectively.

The noise attenuation is appreciable even with a first-order sigma-delta modulator, that is, a modulator comprising a single integrator upstream of the quantizer, but to achieve the high signal/noise ratios required of high-resolution analog-digital converters, it is necessary to use higher-order modulators, that is, modulators comprising several integrators in cascade.

However, if a higher-order modulator is used, stability problems arise. Stability is determined by the type of input signal, in particular, by signals which exceed the input range of the circuit, by initial conditions upon switching-on, and by the possible presence of fluctuations in the supply voltage.

As soon as a departure from ideal operative conditions takes place and, more precisely, when the gain of an element of the feedback loop falls below a certain limit, the modulator becomes unstable and tends to oscillate. The quantizer is an element of the feedback loop, the gain of which is subject to variations with variations in the operating conditions. Conditions are referred to as unstable when the voltages of the internal analog nodes reach values higher than the maximum design range. In order to re-establish conditions of stability, intervention from outside the circuit is required.

For low-pass sigma-delta modulators, various methods have been proposed and differ from one another in the way in which instability is detected and in the action undertaken to re-establish stability.

A first method provides for the connection of limiter elements in parallel with the capacitors of the integrators. The selection of the thresholds of the limiters is critical; in fact, if the thresholds are close to the limits of the dynamic range of the operational amplifiers of the integrators, the signal may also be limited during normal operation with high input-signal levels, causing distortion; if, on the other hand, the thresholds are too low, there is a low signal/noise ratio. This solution cannot therefore be used in applications in which linearity is essential and a high value of the signal/noise ratio is required.

A second method provides for detection of the oscillation which occurs in instability conditions and for resetting of the state variables of the modulator as soon as the oscillation is detected.

In order to detect instability, it has been proposed to measure the analog voltages of the internal nodes of the circuit in order to compare them with respective predetermined reference values. If the reference values are exceeded, the system is considered unstable. A method of detecting instability by monitoring the digital output signal has also been proposed; more particularly, it has been proposed to define a sequence of bits which corresponds to an instability state and to monitor the output bit-stream in order to recognize the appearance of such a sequence and consequently to indicate an instability state.

In both methods, as soon as instability is detected, the output voltages of all of the integrators are reset so that, if the cause of the instability has ceased, the operation of the modulator is returned to stable operating conditions. This latter operation may require a relatively long recovery time, which is longer the higher is the order of the modulator and the larger is its input dynamic range.

BRIEF SUMMARY OF THE INVENTION

The embodiments of the present invention overcome the limitations of the prior art with a method and a circuit for re-establishing the stability of a sigma-delta modulator of an order greater than one, within very short times.

This aim is achieved by the implementation of the method and by the provision of a circuit that includes a sigma-delta modulator having a plurality of integrator stages in cascade and a quantizer, and a logic control unit connected to the output of the quantizer and to respective resetting inputs of their integrator stages, the logic unit including a circuit for storing a bit sequence corresponding to an instability state of the modulator, and a circuit for monitoring the output bit stream of the modulator. The circuit further includes a circuit for sending resetting signals to at least one of the integrator stages when the instability sequence is recognized in the output bit stream.

In accordance with another aspect of the invention, a method of re-establishing the stability of a sigma-delta modulator having a plurality of integrator stages in cascade along with a quantizer is provided. The method includes defining a bit sequence corresponding to an instability state of the modulator, monitoring the output bit-stream of the modulator to check whether it comprises the instability sequence, and, when the instability sequence is detected, resetting the last integrator stage and, progressively, resetting one or more preceding integrator stages until the instability sequence is no longer detected.

BRIEF DESCRIPTION OF THE SEVERAL VIEWS OF THE DRAWINGS

The invention will be understood better from the following detailed description of a non-limiting embodiment thereof, given with reference to the appended drawings, in which.

DETAILED DESCRIPTION OF THE INVENTION

Figure 1:
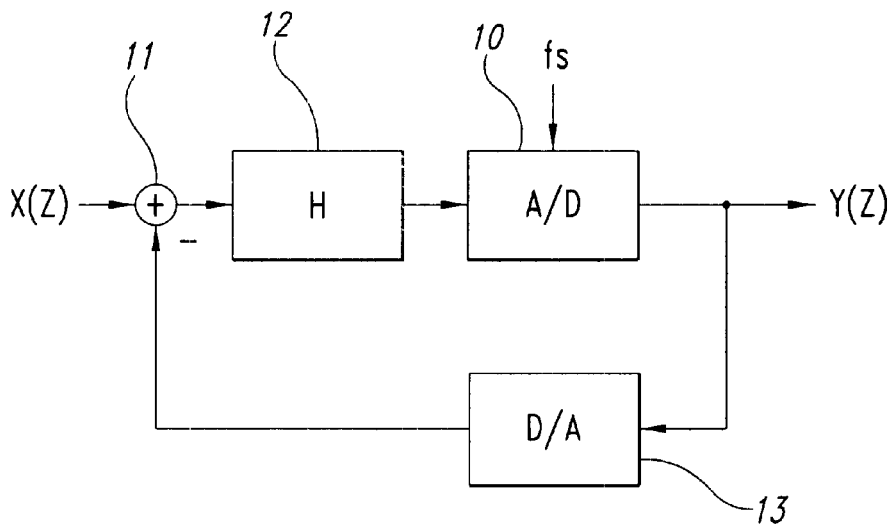
FIG. 1 is a block diagram of a conventional first-order sigma-delta modulator.

FIG. 1 shows a conventional sigma-delta modulator that includes an analog-digital (A/D) converter, or quantizer, 10 and a feedback circuit constituted by an adder node 11, an integrator (H) 12, and a digital analog (D/A) converter 13. An analog input signal X(z) is applied to the adder node 11. The output signal of the adder node is integrated by the integrator 12 and is then converted into digital form by the quantizer 10. The conversion takes place at a sampling frequency fs. The digital output Y(z) of the modulator is changed back to analog form by the digital-analog converter 13 and is applied, with its sign inverted, to the adder node 11. The adder node 11 thus supplies an error signal to the integrator 12. The effect of the feedback loop is such that the output Y(z) is a digital signal which oscillates about the value of the analog input signal. The energy of this oscillating signal constitutes the quantization noise. Typically, the quantizer 10 and the digital-analog converter 13 are single-bit converters so that the quantization noise is high. It can be shown that the transfer function Y(z)/X(z) of the signal is that of a low-pass filter, the pass-band of which is determined by the characteristics of the integrator 12, and the transfer function of the noise is that of a high-pass filter the pass-band of which is determined by the sampling frequency fs. If the output of the modulator is connected to a decimation filter, the resulting circuit is an analog-digital converter. By suitably selecting the cut-off frequency of the decimation filter, the input signal is not attenuated significantly, whilst the quantization noise is greater attenuated.

Figure 2:
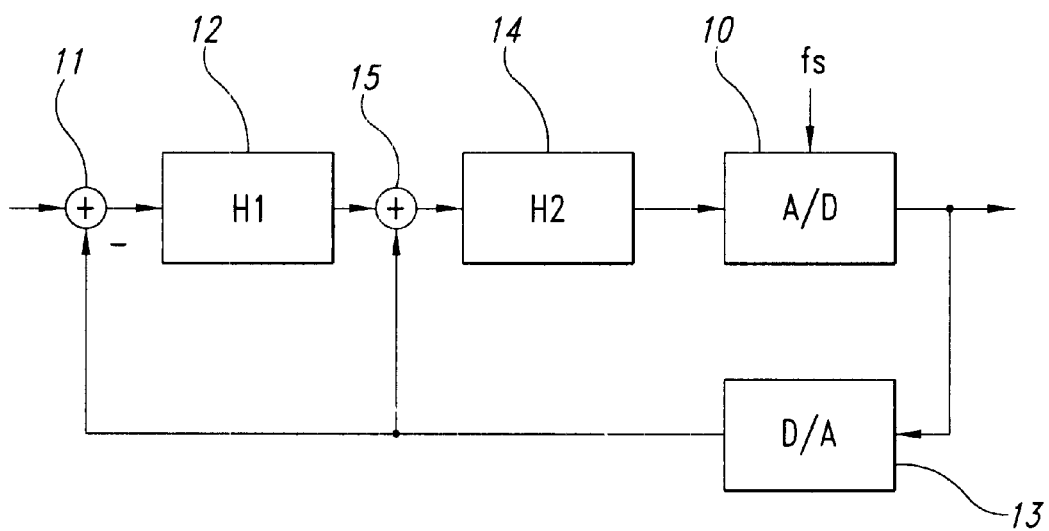
FIG. 2 is a block diagram of a conventional second-order sigma-delta modulator.

As already mentioned, to achieve a high degree of attenuation of the quantization noise, as is necessary to produce high-resolution analog-digital converters, it is necessary to use modulators of orders greater than one. FIG. 2 shows a second-order analog-digital modulator. It differs from that shown in FIG. 1 in that it comprises a second integrator (H2) 14, connected in cascade with the first integrator (H1) 12 by means of a second adder node 15, and in that a feedback signal is also applied to the second adder node. This modulator operates in the same manner as the modulator of FIG. 1 but has improved attenuation of the quantization noise, that is, the curve which represents the passband of the noise has a steeper leading edge. However, it has been found that, with the use of two or more integrators, there are higher signal amplitudes and phase delays which reduce the mean gain of the quantizer so that the system may become unstable and may tend to oscillate.

Figure 3:
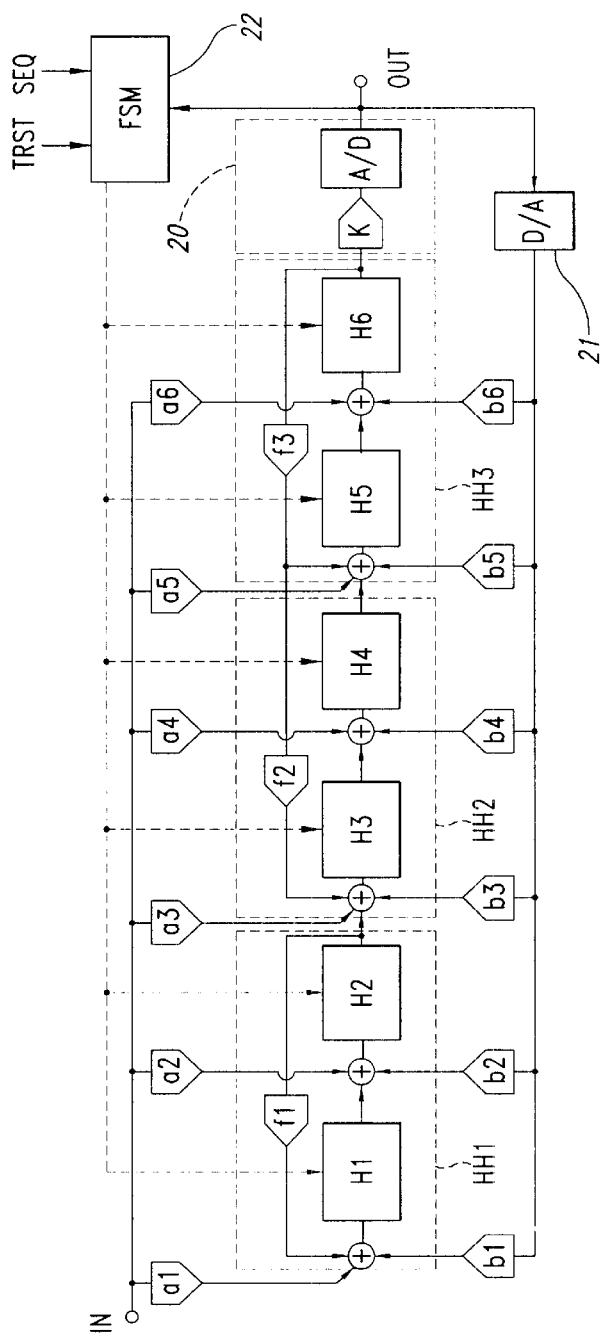
FIG. 3 is a block diagram of a sigma-delta modulator according to the invention.

The embodiment of the invention shown in FIG. 3 is a sixth-order modulator, that is, a modulator comprising six integrators, indicated H1–H6, in cascade. The input terminal of each integrator is connected to the output terminal of the preceding integrator by means of an adder. An input signal is applied to the various adders with different weights, which are determined by suitable coupling means with scale coefficients a1-a6. The output terminal of the last integrator H6 is connected to the input terminal of a single-bit analog-digital converter or quantizer 20, the output OUT of which can be connected to a digital decimation filter, not shown. The output of the quantizer 20 is also connected to the various adders by means of a digital-analog converter 21, which is likewise a single-bit converter, and by suitable coupling means with scale coefficients b1-b6.

In this embodiment, the integrators are connected in pairs by suitable feedback means f1, f2 and f3 to form three resonators HH1, HH2, HH3. The modulator behaves as a band-pass filter, the pass-band of which is centered on a frequency other than zero and determined by the feedback means f1, f2 and f3. All of the coefficients are selected so as to achieve the desired signal and noise transfer functions. A control and stabilization logic unit 22 is connected to the output terminal OUT of the modulator and to the integrators by respective resetting terminals. This unit is preferably constituted by a so-called finite states machine (FSM) and is programmed so as to monitor the output bit-stream of the quantizer 20 to check whether a predetermined bit sequence SEQ corresponding to an instability condition of the modulator appears therein. This sequence can be identified experimentally by bringing about an instability state of the modulator and observing the output bit-stream. The sequence is entered and stored in the logic unit 22.

The unit 22 is also programmed to send a reset signal to the last integrator H6 as soon as the instability sequence is recognized in the output signal. The reset-signal duration TRST, which is also entered and stored in the unit 22, is selected so as to be long enough to ensure effective resetting of the integrator, that is, in practice, so as to discharge the capacitors of the integrator completely.

Normally, resetting of the last integrator suffices to re-establish the stability of the modulator. An instability situation is in fact caused by an overload in the node between the last integrator and the quantizer so that the gain of the quantizer, indicated k in FIG. 3, is too low and the feedback of the system becomes positive; when the last integrator is reset, the gain of the quantizer increases and the feedback tends to become negative again, returning the system to stability. In other words, after the last integrator has been reset and before it is reactivated, the modulator behaves as a lower-order modulator and thus tends to be more stable.

It is important to point out that the noise caused by the resetting operation is processed in accordance with the transfer function of the preceding integrators H1 to H5 and that the time required for the modulator to resume its operation is very short since it is due solely to the recovery time of the last integrator H6.

If, after this operation, the unit 22 recognizes the instability sequence in the output bit-stream again, a resetting signal is applied both to the integrator H6 and to the preceding integrator H5. If the instability is still not eliminated, the above-described operations are repeated, increasing the number of stages reset by one unit each time.

The probability of finding an instability condition which requires intervention on all of the integrator stages during normal operation of the modulator is very low so that, in most cases, the noise of the resetting operation is processed by at least one integrator and the time taken to re-establish the operation of the modulator is always less than would be required if all of the integrators were reset simultaneously.

The above-described technique can be implemented in general by any type of sigma-delta modulator, either of the low-pass or of the band-pass type. However, for the band-pass modulator shown in FIG. 3, a slightly different method may advantageously be adopted. More particularly, the resetting operations involve, first of all, the last integrator and then also the penultimate integrator as in the general method described above, but then, if the instability sequence is still detected, the two integrators of each of the two resonators HH3 and HH4 are reset, and then, if necessary, all of the integrators of the modulator.

Figure 4:
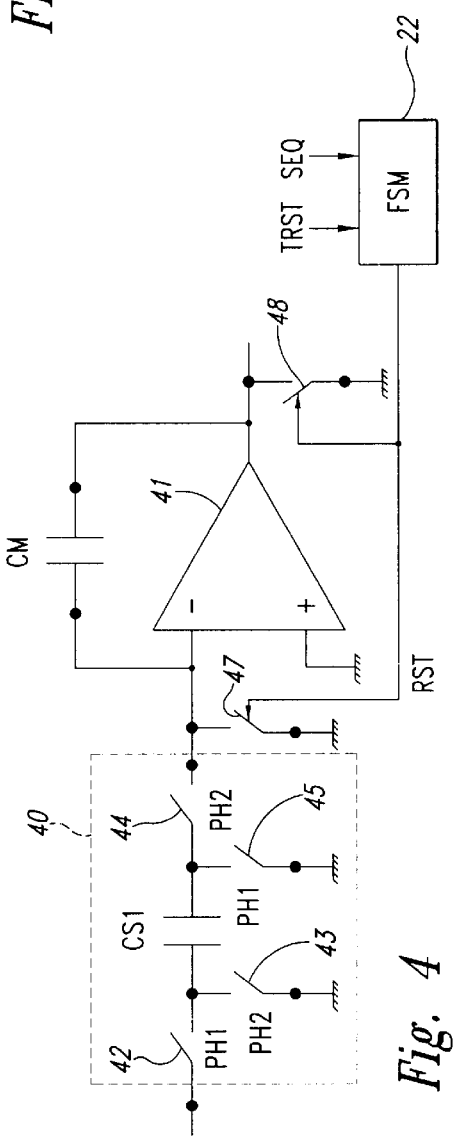
FIG. 4 is an electrical diagram of an integrator usable in the modulator of FIG. 3.

FIG. 4 shows how a resetting operation is performed on a generic integrator stage.

The integrator stage is constituted by a switched capacitor circuit 40 and by an operational amplifier 41 with feedback by means of a capacitor CM so as to operate as an integrator. The circuit 40 is constituted by a capacitor CS1 and by electronic switches 42–45 which can preferably be formed by MOS transistors.

The switches are controlled by two non-overlapping periodic timing signals PH1, PH2 which have the sampling frequency fs and are such that when PH2 is at a high level, PH1 is at a low level.

During the stage at which the signal PH1 is high, so that the switches 42 and 45 are closed and the switches 43 and 44 are open, the capacitor CS1 is charged to the voltage of the analog input signal. During the stage at which PH1 is low, so that the switches 42 and 45 are open and the switches 43 and 44 are closed, the capacitor CS1 is discharged through the path which goes, on one side, to earth and, on the other side, to the inverting input of the operational amplifier, which input is at the "virtual" earth owing to the feedback. For input-signal frequencies much lower than the frequency of the signals PH1 and PH2, the circuit 40 behaves as a resistor. The signal which is present at the inverting input of the operational amplifier is integrated, so that, at the output of the operational amplifier there is a signal which is the integral of the input signal.

Two further electronic switches 47 and 48 are provided for the resetting of the integrator stage and are connected between the inverting input of the amplifier and earth and between the output of the amplifier and earth, respectively. The switches, which are normally open, are closed by a reset signal RST of predetermined duration TRST generated by the unit 22.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit, comprising a sigma-delta modulator having a plurality of integrator stages in cascade and a quantizer and a logic control unit connected to the output of the quantizer and to respective resetting inputs of the integrator stages, the logic unit comprising means for storing a bit sequence corresponding to an instability state of the modulator means for monitoring the output bit-stream of the modulator, and means for sending resetting signals to at least one of the integrator stages when the instability sequence is recognized in the output bit-stream.

2. The circuit of claim 1 wherein the logic control unit comprises means for determining the duration of the resetting signals.

3. The circuit of claim 2 wherein the logic control unit comprises input means for entering data that define the bit sequence corresponding to an instability state and data that define the duration of the resetting signals.

4. The circuit of claim 1 wherein the integrator stages are connected in a manner such as to form three resonators in cascade.

5. The circuit of claim 1, comprising a digital decimation filter connected to the output of the quantizer.

6. A modulator circuit, comprising:
a sigma-delta modulator comprising a plurality of integrator stages coupled in sequence by adder nodes, including a first adder node coupled to the input of a first integrator stage;
a quantizer having an input coupled to an output of a last integrator stage of the plurality of integrator stages and an output;
a control circuit coupled to the output of the quantizer and having an output coupled to a resetting input on each of the plurality of integrator stages, the control circuit configured to receive as input a bit sequence corresponding to an instability state of the modulator and data that defines the duration of a resetting signal to be sent by the control circuit to each of the plurality of integrator stages in a pre-determined sequence; and
a digital-analog converter coupled to the output of the quantizer and having an output coupled to each adder node, the control circuit configured to monitor an output bit stream of the quantizer and to detect an instability sequence, and to send the resetting signal to the plurality of integrator stages when the instability sequence corresponds to the stored bit sequence in the control circuit.

7. The circuit of claim 6, wherein the plurality of integrator stages are organized into pairs of integrator stages, each pair forming a resonator, and wherein the control circuit is configured to first send the resetting signal to a last resonator, and then to preceding resonators in sequence until the instability sequence is no longer detected in the output bit stream.

8. The circuit of claim 7, wherein each integrator stage comprises a reset circuit, each reset circuit comprising a switched capacitor circuit and an operational amplifier, the switched capacitor circuit comprising electronic switches controlled by two non-overlapping periodic timing signals having a frequency the same as a sampling frequency of the modulator and first and second reset switches coupled to the control circuit for receiving the resetting signal.

9. The circuit of claim 6, wherein the control circuit is configured to send the resetting signal to the last integrator stage first and then progressively to the other integrator stages until the instability sequence is no longer detected in the output bit stream.

10. A modulator circuit, comprising:
a sigma-delta modulator comprising a plurality of integrator stages connected in series in a manner to form three resonators in cascade, a quantizer coupled to an output of the last of the three resonators, and a control circuit coupled to the output of the quantizer and coupled to respective resetting inputs of each integrator stage, the control circuit configured to store a bit sequence corresponding to an instability state of the modulator, monitor the output bit stream of the modulator to detect an instability sequence in the output bit stream, and send resetting signals to the integrator stages in a progressive sequence when the instability sequence is detected in the output bit stream and until the instability sequence is no longer detected in the output bit stream.

11. The circuit of claim 10, wherein the control circuit is configured to receive input data that define the duration of the resetting signals.

12. The circuit of claim 11, wherein the resetting signals are first sent to the last of the three resonators, and then progressively to the second resonator and then the first resonator in sequence until the instability sequence is no longer detected in the output bit stream.

13. A method of stabilizing a sigma-delta modulator having a plurality of integrator stages coupled in cascade in pairs, each pair forming a resonator, and a quantizer following the last resonator, and a control circuit coupled to the quantizer and each of the plurality of integrator stages, the method comprising:

storing in the control circuit a bit sequence corresponding to an instability state of the modulator;

monitoring an output bit stream of the modulator at the quantizer output for determining the presence of an instability sequence;

when the instability sequence that corresponds to the stored bit sequence is detected, sending a reset signal from the control circuit to the last resonator and, progressively, one or more preceding resonators until the instability sequence is no longer detected.

14. The method of claim 13, wherein defining the bit sequence further comprises defining a duration of the resetting signals and storing the same in the control circuit.

* * * * *